United States Patent [19]
Ueno

[11] Patent Number: 5,815,628
[45] Date of Patent: Sep. 29, 1998

[54] ORDERED SEMICONDUCTOR HAVING PERIODICAL DISORDER AND DEVICES MADE THEREFROM

[75] Inventor: Yoshiyasu Ueno, Ibaraki, Japan

[73] Assignee: NEC Corporation, Tokyo, Japan

[21] Appl. No.: 633,882

[22] Filed: Apr. 17, 1996

[51] Int. Cl.[6] .................................................. G02B 6/10
[52] U.S. Cl. ........................................................ 385/131
[58] Field of Search ................................ 372/43, 46, 50, 372/40, 45, 130, 26, 29; 385/14, 131; 257/83, 85, 14, 96, 99, 22; 437/133, 129, 173, 936, 174

[56] References Cited

U.S. PATENT DOCUMENTS

| | | | |
|---|---|---|---|
| 4,654,090 | 3/1987 | Burnham et al. | 148/1.5 |
| 5,107,514 | 4/1992 | Goto | 372/46 |
| 5,145,792 | 9/1992 | Hirata | 372/43 |
| 5,287,376 | 2/1994 | Paoli | 385/14 |
| 5,395,793 | 3/1995 | Charbonneau et al. | 437/133 |

OTHER PUBLICATIONS

"Ovservation of strong Ordering in GaxIn P Alloy semiconductors" phys. Rev. Lett., vol. 60, NO 25, June 20, 1988, pp. 3645–3648 by Gomyo.

L. Sundheimer et al., Large nonlinear phase modulation in quasi–phase–matched...processes, *Opt. Lett.*, vol. 18, No. 17, Sep. 1, 1993, pp. 1397–1399.

S. J. Yoo et al., "Quasi–phase–matched second–harmonic generation in AlGaAs...wafer–bonding", *Appl. Phys. Lett.*, vol. 66, No. 25, Jun. 19, 1995, pp. 3410–3412.

J.H. McFee and G.D. Boyd, "Redetermination of the Nonlinear Optical...$Ag_3SbS_3$", *Appl. Phys. Lett.,* vol. 17, No. 2, Jul. 15, 1970, pp. 57–59.

C. Kelaidis et al., "Asymmetric Two–Step GaAlAs Quantum Well for Cascaded Second–Order Processes", *IEEE Trans. Quantum Electron.*, vol. 30, No. 12, Dec. 1994, pp. 2998–3005.

W. Metzger et al., "Photonic Integrated Transceiver for the Access Network", *Proc. of 20th Eur. Conf. Opt. Comm. ECOC '94*, vol. 4 Post–Deadline Papers, 1994, p. 87–90.

Gomyo et al., "Observation of Strong Ordering in $Ga_xIn_{1-x}P$ Alloy Semiconductors", *Phys. Rev. Lett.*, vol. 60, No. 25, Jun. 20, 1988, pp. 2645–2648.

Ueno et al., "Phase Matchable Second–Order Susceptibility of GaInP Crystals at 1.5$\mu$m", *European Optical Society, Topical Meeting Digest Series*, vol. 7, Jan. 14–18, 1996, pp. 185–186.

T. Kurimoto et al., "Electronic structure of the $(GaP)_1(111)$ strained–layer superlattice", *Phys. Rev. B*, vol. 40, No. 6, Aug. 15, 1989, pp. 3889–3895.

(List continued on next page.)

*Primary Examiner*—Akm E. Ullah
*Attorney, Agent, or Firm*—Sughrue, Mion, Zinn, Macpeak & Seas, PLLC

[57] ABSTRACT

Disclosed is a novel combination of a particular class of semiconductors with a particular waveguide structure, realizing a practically efficient optical semiconductor device. The class of material used is ordered semiconductors, examples of which are GaInP and AlGaInP in which atomic-layer superlattices are formed. These superlattices are demonstrated to be useful with respect to a particular nonlinear mechanism, by combining with a particular waveguide structure known as a quasi-phase matching structure. The device disclosed is particularly useful for being utilized as a light switch and a light-wavelength converter used for ultrafast optical communication.

17 Claims, 7 Drawing Sheets

OTHER PUBLICATIONS

Y.R. Shen, The Principles of Nonlinear Optics, John Wiley & Sons, 1984, pp. 13, 16–19.

A. Mascarenhas et al., "Polarized Band–Edge Photoluminescence and Ordering in $Ga_{0.52}Ub_{0.48}P$", *Phys. Rev. Lett.*, vol. 63, No. 19, Nov. 6, 1989, pp. 2108–2111.

T. Kanata et al., "Valence–band Splitting in Ordered $Ga_{0.5}In_{0.5}P$ Studied...Polarization", *Phys. Rev. B*, vol. 45, No. 12, Mar. 15, 1992, pp. 6637–6642.

R. Tycko et al., "Quantitative Study of Atomic Ordering in $Ga_{0.5}In_{0.5}P$ Thin Films...Resonance", *Phys. Rev. B*, vol. 45, No. 23, pp. 13452–13457.

Photonics In Switching, vol. 1, Academic Press, Inc., 1993, ISBN 0–12–496051–0, pp. 81–87 and 98–103.

Ueno et al., "Novel Window–Structure AlGaInP Visible––Light Laser Diodes with Non–Absorbing...Disordering", *Japanese Journal of Applied Physics*, vol. 29, No. 9, Sep., 1990, pp. L1666–L1668.

Villeneuve et al., "Demonstration of All–Optical Demultiplexing at 1555nm With an AlGaAs Directional Coupler", *Electronics Letters*, vol. 29, No. 8, April 15, 1993, pp. 721–722.

Assanto et al., "All–Optical Switching Devices Based On Large Nonlinear Phase Shifts From Second Harmonic Generation", *Appl. Phys. Lett.*, vol. 62, No. 12, Mar. 22, 1993, pp. 1323–1325.

Baek, "All–Optical Switching in a Hybrid Mach–Zehnder Interferometer as a Result of Cascaded Second–Order Nonlinearity", *Optics Letters*, vol. 20, No. 21, Nov. 1, 1995, pp. 2168–2170.

T. Suhara et al., "Theoretical Analysis of Waveguide Second–Harmonic Generation Phase Matched with...Gratings", *IEEE Journal of Quantum Electronics*, vol. 26, No. 7, Jul. 1980, pp. 1265–1276.

R. DeSalvo et al., "Self–Focusing and Self–Defocusing by Cascaded Second–Order Effects in KTP", *Optics Letters*, vol. 17, No. 1, Jan. 1, 1992, pp. 28–30.

G.I. Stegeman et al., "Large Nonlinear Phase Shifts in Second–Order Nonlinear–Optical Processes", *Optics Letters*, vol. 18, No. 1, Jan. 1, 1993, pp. 13–15.

L.A. Eyres et al., "Fabrication of GaAs Orientation Template Substrates for Quasi–Phasematched Guided–Wave Nonlinear Optics", *Nonlinear Guided–Wave Phenomena*, Dana Point, FL, Feb. 1995, pp. 156–158.

R.W. Boyd, Nonlinear Optics, Academic Press, Inc., pp. 32–47, 52–53, and 430–431.

M.M. Fejer et al., "Quasi–Phase–Matched Second Harmonic Generation: Tuning and Tolerances", *IEEE Journal of Quantum Electronics*, vol. 28, No. 11, Nov. 1992, pp. 2631–2633 and 2653–2654.

NATURAL SUPERLATTICE
$Ga_{0.5}In_{0.5}P$

○ P
◐ In
● Ga

DISORDERED
$Ga_{0.5}In_{0.5}P$

○ P
◐ In
● Ga

ORDERED SEMICONDUCTOR HAVING PERIODICAL DISORDER AND DEVICES MADE THEREFROM

BACKGROUND OF THE INVENTION

(1) Field of the Invention

This invention relates to optoelectronic devices used largely in communication systems. More particularly, this invention relates to all optical devices such as switches and converters used for ultrafast optical communications and information processing technology.

(2) Description of Related Arts a. General

When a light having a given fundamental wavelength traverses matter, its electromagnetic radiation interacts with the dipoles and causes oscillation of the dipoles. As a result, the dipoles themselves become sources of electromagnetic radiation. When the incident light causes only small vibrations of the dipoles, the dipoles would emit radiation of the same fundamental wavelength as the incident light. However, as the magnitude of the oscillations increases, nonlinear interactions between the light and the matter generate harmonics at multiples of the light wave frequency. The magnitude of the nonlinear effect is proportional to the square of the power of the incident light. Of particular interest in the field of optical communications is the second harmonic (frequency doubling). The critical parameter for generating practical levels of second harmonics is the power per unit area (power density). The level of power density required to generate acceptable second harmonic generation depends on the nonlinear index of the material used.

Depending on the index of refraction of the matter at the fundamental wavelength, the light having the fundamental wavelength will travel at a certain speed $n_1$. However, the generated second harmonic wave will travel at a different speed, $n_2$, which depends on the index of refraction at the second harmonic wavelength. In general, $n_2$ is faster than $n_1$. Consequently, the difference in the phase velocities of the two waves causes a phase slip which leads to a repetitive growth and decay of the second harmonic intensity. In addition, the interaction between the fundamental and the second harmonic causes a phase shift of the fundamental wavelength.

On the other hand, if the phase speeds could be matched by some means (for example, by matching the refractive indexes at the two wavelengths), the intensity of the second harmonic wave would grow quadratically with distance. In some anisotropic materials, a propagation direction can be found in which the fundamental and the second harmonic waves propagate at the same speed. This phase matching property is generally known as birefringence. Unfortunately, phase matching in most semi-conductors is practically impossible to achieve since their zinc-blende crystal structure does not exhibit birefringence.

Another technique which supports growth of the second harmonic wave is called Quasi-Phase Matching (QPM). According to one method for achieving QPM, the relative phase between the waves is repeatedly inverted after each, or a number of, coherent lengths. As a consequence, on an average the proper phase (power flow from the fundamental to the harmonic) is maintained to support growth of the second harmonic. One proposed technique for periodic inversion uses a stack of thin wafers of nonlinear crystals, wherein the wafers are alternately rotated 180° with respect to each other. Another proposed technique involves ferroelectric crystals (such as $LiNbO_3$) wherein regions of periodically reversed spontaneous polarization Ps are formed.

b. Light Switches

The speed of conventional light switches used in communications is currently limited to 10–20 Gb/s. To increase the capacity of networks and the speed of information processing, faster light switches have been explored. The problem of ultrafast all-optical light switches based on nonlinear optics has been their impractical energy consumption. Recently, M. L. Sundheimer et al. demonstrated nonlinear phase shifts in a quasi-phase-matched (QPM) KTP waveguide (Opt. Lett., Vol. 18, No. 17, Sep. 1, 1993, pp. 1397–99), based on a new nonlinear-optical mechanism. This mechanism is called $\chi^{(2)}:\chi^{(2)}$ cascading. The speed of this mechanism is supposed to be over 100 Gb/s, which is about ten times faster than the current technology.

This mechanism is attracting attention because it could decrease the energy consumption of ultrafast switches down to a practical level. However, in order to decrease the energy consumption of these switches, solutions for the following two requirements are needed. One requirement is to find phase-matching geometries in waveguides used for the switches. The other requirement is to find a material having a sufficiently large second-order nonlinear coefficient, $d_{ij} \approx \chi_{ijk}^{(2)}/2$, so that second harmonic growth can occur at a relatively low input power density. The solution for these requirements must be devised under the general optimization requirement for switches, i.e., the actual switching device needs to operate near, but not at, the QPM, so that switching operation would be enhanced but energy flow from the signal wave to the second harmonic would be minimized.

For the above-mentioned QPM KTP waveguide, quasi phase matching was realized by periodically inverting the nonlinear coefficient by an ion-exchange technique. A switch based on this QPM KTP waveguide, however, would still need impractically large light power, because the second-order susceptibility of KTP, $d_{33}$=18.5 picometer/Volt (pm/V), is not sufficiently large.

While the above-mentioned works on KTP achieved a rather wide popularity, from a practical view point a more attractive medium for achieving second harmonic generation and quasi phase matching would be a semiconductor. The reason is that discovering a method to construct second harmonic generation-based devices using semiconductors would facilitate integration of the laser sources and the devices on a single substrate. However, as noted above, semiconductors having zinc-blende structure do not exhibit birefringence and to-date there has been no report of successful phase matching using birefringence of any semiconductor. Therefore, research is concentrated on finding methods for achieving quasi phase matching in semiconductors capable of second harmonic generation.

Recently a QPM AlGaAs waveguide was demonstrated by S. J. B. Yoo et al. (*Appl. Phys. Lett.,* Vol. 66, No. 25, Jun. 19, 1995, pp. 3410–12). AlGaAs is supposed to have a larger nonlinear coefficient than KTP, because the nonlinear coefficient of GaAs, a related material, is 130 pm/V (J. H. McFee and G. D. Boyd, Appl. Phys. Lett. vol. 17, p. 57, 1970). However, while second harmonic generation can be observed in AlGaAs, impractically high power is required to achieve a rather negligible amount of second harmonic generation. In order to improve the second harmonic output, quasi phase matching was realized by periodic crystal domain inversion using wafer bonding by atomic rearrangement, periodical etching, and regrowth.

The principal disadvantages of this waveguide, however, come from the wafer-bonding process in which, all atomic bonds need to be bonded accurately between the two semiconductor surfaces. This wafer-bonding process induces defects at the bonding interfaces. The defects reduce the waveguide quality, stability, reliability, uniformity, and reproducibility. In addition, the larger the wafers are, the more difficult it becomes to bond those wafers. Not only mass-production but also integration of switches would be, therefore, limited by the wafer-bonding process.

Another type of QPM AlGaAs waveguide was proposed for use in cascading light switches by C. Kelaidis et al. (*IEEE Trans. Quantum Electron.*, Vol. 30, No. 12, December 1994, pp. 2998–3005). They noted that because of the zinc-blende structure of most semiconductors, the choice of orientation with respect to the light propagation has been restricted so that the $\chi_{xyz}^{(2)}(d_{14})$ susceptibility component is utilized. In order to induce second-order nonlinearities in a different direction, such as where a second-order susceptibility component $\chi_{zzz}^{(2)}(d_{33})$ exists, they designed asymmetric quantum wells as nonlinear media and predicted an effective nonlinear coefficient of 100 pm/V, assuming that GaAs has a nonlinear coefficient of 208 pm/V. However, when assuming a nonlinear coefficient of 130 pm/V for GaAs, based on what is believed to be a more reliable report (McFee and Boyd, 1970), the effective coefficient would be 60 pm/V.

The asymmetric quantum well consisted of two thin layers (quantum wells) with different well thicknesses and different Al concentration (i.e., different bandgaps). To achieve quasi phase matching, they proposed domain reversal by inversion of the asymmetric quantum wells. Another technique they proposed is periodical disordering of the asymmetric quantum wells.

While AlGaAs may provide better prospect for devices than KTP because of the possibility of device integration, practical implementations would involve complicated design and production. The process for making the asymmetric quantum well itself involves steps that may prove harmful to other devices on the substrate. Moreover the design of the quantum well cannot be separated from the design for achieving QPM.

In addition to KTP and AlGaAs, other nonlinear-optical materials having second-order susceptibility have been reported, such as $LiNbO_3$, DANS, DAST, etc. Amongst them, DAST has the largest nonlinear coefficient of 200–400 pm/V. The size of high-quality DAST single crystals is, however, too small so far. Besides, phase matching techniques for this material are not known.

c. Light Wave Converters

A light-wavelength converter is an important part in wavelength-domain-multiplexing (WDM) telecommunication systems. The converter relays and distributes signals from one WDM channel to another and others, respectively. Light-wavelength converters are also important for converting light signal sequences with wavelengths of approximately 1.55 $\mu$m to those of approximately 1.3 $\mu$m. Light signals with wavelengths of approximately 1.55 $\mu$m are used for long-distance-network communications, while those of approximately 1.3 $\mu$m are used for local-area network communications. An all-optical light-wavelength converter would enable connection of long-distance networks with local-area networks directly without use of electric-optical signal conversions.

Conventionally, hybrid devices consisting of both optical and electronic devices are used for changing the wavelength of light signals. Recently, W. Metzger et al. demonstrated a monolithic transceiver converting directly the signal wavelengths from 1.55 to 1.3 $\mu$m, and vice versa (Proc. of 20th Eur. Conf. Opt. Comm. ECOC '94, vol. 4 Post-Deadline Papers, p. 87, 1994). In this proposal, a photo diode and a laser diode were integrated on one chip, which leads to improved assembly costs, size, and reliability. To operate this transceiver, however, a high-frequency electronic signal-processing device is still needed outside the monolithic transceiver.

SUMMARY OF THE INVENTION

An object of the present invention is to improve the above-mentioned issues existing in the prior arts. More specifically, it is an object of the invention to provide a structure supporting second harmonic generation and quasi phase matching in semiconductors.

It is another object of the invention to provide a structure supporting second harmonic generation and quasi phase matching in semiconductors which is adaptable to operate as a light switch.

Yet another object of the invention is to provide a structure supporting second harmonic generation and quasi phase matching in semiconductors which is adaptable to operate as a light converter.

Still another object of the invention to provide a structure supporting second harmonic generation and quasi phase matching in semiconductors which is easily integrated with a semiconductor laser device.

These and other objects are achieved in accordance with the present invention by a light switch, a light-wavelength converter, and other related ultrafast devices in which ordered semiconductor crystals are used. Examples of ordered semiconductors are GaInP (Gomyo et al., *Phys. Rev. Lett.*, Vol. 60, No. 25, Jun. 20, 1988, pp. 2645–48), AlGaInP, GaInAs, InAlAs, and GaInPAs. While the crystal structure of ordered semiconductor has been previously reported, the non-linear properties of these materials have not been previously recognized. However, as demonstrated by the present inventor and disclosed hereinbelow, the ordered semiconductor crystals have two key advantages; one for phase matching and the other for the magnitudes of $d_{ij}$ coefficients.

A particular structure is disclosed in which the ordered atomic-layer superlattices are utilized for nonlinear phase shift, sum-frequency generation and second harmonic generation, and a periodic disordered regions in the superlattices are created for quasi-phase matching.

BRIEF DESCRIPTION OF THE DRAWINGS

Other objects and advantages of the present invention will become apparent from the following description of the preferred embodiment with reference to the drawings, in which:

FIGS. 10A and 10B are schematic diagrams of two exemplary configurations of using the device according to the present invention to provide logic switching, while

DETAILED DESCRIPTION OF THE PREFERRED EMBODIMENT

Figure 1A:
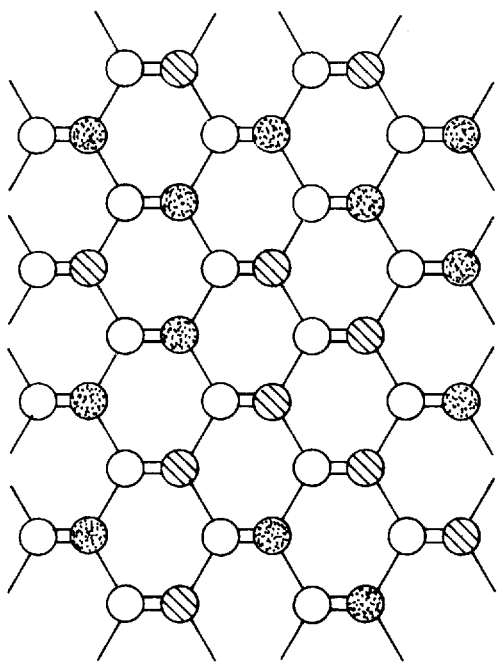
FIG. 1a depicts the crystal structure of an ordered semiconductor (GaInP)

As noted above, ordered semiconductors were not previously recognized to support second harmonic generation. In addition, while it was recognized that AlGaAs and GaInP (or AlGaInP) have similar crystal structure (both are type III–V semiconductors) one significant difference is that the crystal axis of GaInP (or AlGaInP) is not parallel to the growth axis (FIG. 1a). This was first reported by Gomyo et al., *Phys. Rev. Lett.*, Vol. 60, No. 25, pp. 2645–48, and also noted by the present inventor in: Ueno et al., "Phase Matchable Second-Order Susceptibility of GaInP Crystals at 1.5 m", *European Optical Society, Topical Meeting Digest Series,* Vol. 7, Jan. 14–18, 1996, pp. 185–186, which is incorporated herein by reference.

Traditional consideration given to second harmonic generation is that the incident fundamental wave needs to be polarized perpendicularly or in parallel to the growth axis, which, in materials previously investigated, coincided with the crystal axis. Thus, for example, when considering the use of $LiNbO_3$ as a wave guide, the crystal is cut in such a configuration that wave propagation of the incident light is parallel to the crystal structure. However, since the crystal axis of ordered semiconductors is slanted with respect to the growth axis, it is counter-intuitive to think of these materials as second harmonic generators, since wave propagation would not be parallel to the crystal axis. Therefore, in order to investigate any possibility of nonlinear properties of ordered materials, the crystal matrix for the ordered material ($C_{3v}$) must first be transformed.

The present inventor investigated and, as will be shown below, demonstrated that quasi-phase-matching geometries exist for the atomic-ordered semiconductor waveguides. Periodical disordering of an originally ordered waveguide was employed to modulate the $d_{ij}$ coefficients in the propagation direction.

The inventor derived a second-order—nonlinear-coefficient matrix, $d_{ij}$, for an ordered semiconductor crystal on the $T_d$ frame ([1,0,0], [0,1,0], and [0,0,1]) as $$d_{ij}^{(ord;\,Td)} = \begin{pmatrix} -d_{33} & -d_{31} & -d_{31} & d_{14} & d_{15} & d_{15} \\ d_{31} & d_{33} & d_{31} & d_{15} & d_{14} & -d_{15} \\ d_{31} & d_{31} & d_{33} & d_{15} & -d_{15} & d_{14} \end{pmatrix}.$$

This matrix was obtained by geometrical transformation for a conventional matrix for a $C_{3v}$ crystal, $$d_{ij}^{(ord;\,C3v)} = \begin{pmatrix} 0 & 0 & 0 & 0 & d_{15}' & -d_{22}' \\ -d_{22}' & d_{22}' & 0 & d_{15}' & 0 & 0 \\ d_{31}' & d_{31}' & d_{33}' & 0 & 0 & 0 \end{pmatrix},$$

which is defined on the crystal frame ($C_{3v}$; [1,1,0], [$\bar{1}$,1,$\bar{2}$], and [$\bar{1}$,1,1]), based on the fact that symmetry of the ordered crystals belongs to $C_{3v}$. Disordering changes symmetry of the crystal structure to that of zinc-blende ($T_d$). Consequently, disordering changes the nonlinear matrix $d^{ij(ord;\,Td)}$ to a $T_d$-type matrix, $$d_{ij}^{(disord;\,Td)} = \begin{pmatrix} 0 & 0 & 0 & d_{14}'' & 0 & 0 \\ 0 & 0 & 0 & 0 & d_{14}'' & 0 \\ 0 & 0 & 0 & 0 & 0 & d_{14}'' \end{pmatrix}.$$

A comparison between $d_{ij}^{(ord;\,Td)}$ and $d_{ij}^{(disord;\,Td)}$ shows that each component changes by disordering. When periodically disordering the crystal, each component in $d_{ij}^{(ord;\,Td)}$ is modulated between the original value and its counterpart in $d_{ij}^{(disord;\,Td)}$. The (3,3) component is modulated between $d_{33}$ and zero, for example. As a result, the [0,0,1]-polarized fundamental light phase-matches the [0,0,1]-polarized second-harmonic light through the modulated (3,3) component, for example, when the disordering period satisfies the QPM condition. That is, the $d_{33}$ component creates a second harmonic polarization $P_z(2\omega)$ from the Z-polarized fundamental light in proportion to the square of the energy density, $E_z(\omega)^2$. This creates a nonlinear phase shift of the fundamental light based on the $\chi^{(2)}{:}\chi^{(2)}$ cascading mechanism.

Another QPM geometry example is that the [1,1,0]-polarized (or [$\bar{1}$,1,0]-polarized) fundamental light phase-matches [0,0,1]-polarized second-harmonic light through modulation of a nonlinear coefficient between $d_{31}+d_{14}$ and $d''_{14}$. This is shown by the difference between (3,1) components of the following matrices defined on another frame (Td2; [1,1,0], [$\bar{1}$,1,0], and [0,0,1]), $$d_{ij}^{(ord:\ Td2)} = \begin{pmatrix} 0 & 0 & 0 & 0 & d_{15}+d_{14} & \frac{d_{33}-d_{31}}{\sqrt{2}} \\ \frac{d_{33}+d_{31}-2d_{15}}{\sqrt{2}} & \frac{d_{33}+d_{31}+2d_{15}}{\sqrt{2}} & \sqrt{2}\ d_{31} & d_{15}-d_{14} & 0 & 0 \\ d_{31}+d_{14} & d_{31}-d_{14} & d_{33} & \sqrt{2}\ d_{15} & 0 & 0 \end{pmatrix}$$

and $d_{ij}^{(disord:\ Td2)} = \begin{pmatrix} 0 & 0 & 0 & 0 & d_{14}" & 0 \\ 0 & 0 & 0 & -d_{14}" & 0 & 0 \\ d_{14}" & -d_{14}" & 0 & 0 & 0 & 0 \end{pmatrix}$.

These matrices were obtained by geometrically transforming the original matrices $d_{ij}^{(ord:\ C3v)}$ and $d_{ij}^{(disord:\ Td)}$. Although all geometries are not to be listed here, the comparison between $d_{ij}^{(ord:\ Td2)}$ and $d_{ij}^{(disord:\ Td2)}$ clearly shows that more phase-matching geometries exist.

Some semiconductors grown on a (0,0,1)-exact substrate form two different domains. For example, GaInP contains one domain having a $[\bar{1},1,1]$-oriented ordered structure and another containing a $[1,\bar{1},1]$-oriented ordered structure (Gomyo et al., 1988). These two domains co-exist and their volumes are balanced in a crystal. The inventor shows that phase matching is still possible even in this type of ordered semiconductors. A macroscopical (spatial) average of the nonlinear matrices in the two-domain structure were obtained as, $$d_{ij}^{(ord,\ mixed:\ Td)} = \begin{pmatrix} 0 & 0 & 0 & d_{14} & d_{15} & 0 \\ 0 & 0 & 0 & d_{15} & d_{14} & 0 \\ d_{31} & d_{31} & d_{33} & 0 & 0 & d_{14} \end{pmatrix}$$

on the ([1,0,0], [0,1,0], and [0,0,1]) frame and $$d_{ij}^{(ord,\ mixed:\ Td2)} = \begin{pmatrix} 0 & 0 & 0 & 0 & d_{15}+d_{14} & 0 \\ 0 & 0 & 0 & d_{15}-d_{14} & 0 & 0 \\ d_{31}+d_{14} & d_{31}-d_{14} & d_{33} & 0 & 0 & 0 \end{pmatrix}$$

the ([1,1,0], $[\bar{1},1,0]$, and [0,0,1]) frame.

These matrices show that periodical disordering still modulates each component. Disordering modulates the (3,3) component between $d_{33}$ and zero, while it modulates the (3,1) component between $d_{31}+d_{14}$ and $d"_{14}$. So, [0,0,1]-polarized fundamental light phase-matches the [0,0,1]-polarized second-harmonic light, and the [1,1,0]-polarized (or $[\bar{1},1,0]$-polarized) fundamental light phase-matches [0,0, 1]-polarized second-harmonic light, in the same manner mentioned previously.

The QPM structure of ordered semiconductors discussed above has several merits. Processes needed for fabricating the QPM structure, including disordering, cause less defects than wafer bonding. These processes for ordered semiconductors are possible even for 4-inch wafers, which is an advantage for integration and mass production of switches and other all-optical devices. Another merit comes from the period of the ordering structure. The period of the structure is approximately 0.65 $\mu$m, which is an order of magnitude shorter than that for the asymmetric quantum wells. Due to the short period, the disordering process needs less impurity concentration, lower temperature, or shorter processing time. The damage caused by the disordering process is, therefore, less than that for the asymmetric quantum wells.

The third merit is its simplicity compared with the asymmetric quantum wells. For QPM in ordered-semiconductor waveguides, the quantum-well structure is not required since the superlattice itself, rather than the quantum well, is being periodically disordered. Therefore accurate controls of growth processes is not needed. Thus, uniformity, reproducibility, and reliability of the products are improved. The cost of the growth process is reduced as well. Moreover, since according to the present invention second harmonic generation can be achieved without the need for quantum wells, when quantum wells are desire for other purposes (such as for optimizing laser or detector structures integrated on the same semiconductor wafer), the design of the quantum-well structure can be done independently of the QPM design.

The ordered semiconductor crystals also have advantages with respect to magnitude of the $d_{ij}$ coefficients. The $d_{ij}$ coefficients are enhanced near resonance due to dipole moments. The dipole moments originate from the atomic ordering of these semiconductors, while zinc-blende-type semiconductors have no dipole moment. The triagonal-$C_{3v}$ crystal symmetry observed in ordered semiconductors such as GaInP and AlGaInP, for example, allows the existence of dipole moments. The localizations of the valence and conduction bands reported by T. Kurimoto et al. (*Phys. Rev. B*, Vol. 40, No. 6, Aug. 15, 1989, pp. 3889–95) suggests large permanent dipoles. The large difference between the chemical-bond lengths of GaP (5.45 Å) and InP (5.87 Å) also suggests large permanent dipoles.

Referring to Shen's formula (Y. R. Shen, The Principles of Nonlinear Optics, John Wiley & Sons, 1984, specifically, pp. 13, 16–19), resonant enhancements for the nonlinear coefficients are described as:

$$d_{15}' = \frac{1}{2}\ \chi_{xxz}^{(2)} = \frac{1}{2}\ \chi_{xzx}^{(2)} \sim$$

$$\frac{<v|r_x|c><c|r_z|c><c|r_x|v>}{(2\omega - E_g)(\omega - E_g)} =$$

$$\frac{<c|r_z|c><c|r_x|v>|^2}{(2\omega - E_g)(\omega - E_g)}$$

and $$d_{33}' = \frac{1}{2}\ \chi_{zzz}^{(2)} \sim \frac{<v|r_z|c><c|r_z|c><c|r_z|v>}{(2\omega - E_g)(\omega - E_g)} =$$

$$\frac{<c|r_z|c><c|r_z|v>|^2}{(2\omega - E_g)(\omega - E_g)}.$$

where |c> represents the conduction-band state, |v> represents the valence-band state, and $r_z$ represents the displacement operator in the crystal-axis direction. Nonlinear coefficients, $d'_{33}$ and $d'_{31}$, are defined in the crystal frame of reference ([1,1,0], $[\bar{1},1,2]$, and $[\bar{1},1,1]$). $E_g$ is the bandgap energy. ω is the photon energy of the fundamental light. The relation between a set of coefficients defined in the $T_d$ frame and another set defined on the crystal frame are determined by geometrical transformations of the form, $$\begin{pmatrix} d_{33} \\ d_{31} \\ d_{14} \\ d_{15} \end{pmatrix} = \frac{\sqrt{3}}{9} \begin{pmatrix} 4d_{15}' + d_{33}' - 2\sqrt{2}\ d_{22}' + 2d_{31}' \\ -2d_{15}' + d_{33}' + \sqrt{2}\ d_{22}' + 2d_{31}' \\ 2d_{15}' - d_{33}' + 2\sqrt{2}\ d_{22}' + d_{31}' \\ d_{15}' + d_{33}' + \sqrt{2}\ d_{22}' - d_{31}' \end{pmatrix} \approx$$

$$\begin{pmatrix} 0.77d_{15}' + 0.19d_{33}' - 0.54d_{22}' + 0.38d_{31}' \\ -0.38d_{15}' + 0.19d_{33}' + 0.27d_{22}' + 0.38d_{31}' \\ 0.38d_{15}' - 0.19d_{33}' + 0.54d_{22}' + 0.19d_{31}' \\ 0.19d_{15}' + 0.19d_{33}' + 0.27d_{22}' - 0.19d_{31}' \end{pmatrix}.$$

Consequently, the dipole moment, $<c|r_z|c>$, enhances $d_{33}$, $d_{31}$, $d_{14}$, and $d_{15}$. The closer the light energy (ω) is to a half of the bandgap energy ($E_g$), the more the permanent dipole moment enhances these nonlinear coefficients.

This demonstrates another advantage of the ordered semiconductors of the present invention over other inorganic crystals considered by the prior art, such as $LiNbO_3$. That is, since semiconductors have a smaller bandgap than other inorganic crystals, the denominator (2ω-$E_g$) is smaller. Thus, a more significant resonance enhancement is produced in the semiconductors than in other inorganic crystals previously considered for all-optical, nonlinear phase shift based devices.

The existence of a permanent dipole in the excited state, $<c|r_z|c>$, is derived by the present inventor as follows. The symmetries of the valence and conduction bands for the $C_{3v}$ ordered semiconductors are $\Gamma_{4,5}$ and $\Gamma_6$, respectively. Among the three displacement operators $r_x$, $r_y$, and $r_z$, only $r_z$ belongs to the irreducible representation $\Gamma_1$. Reduction of an anti-symmetric representation $\{\Gamma_6 \times \Gamma_6\}$ shows that this representation is irreducible and equals to $\Gamma_1$. Therefore, the $<c|r_z|c> \propto <\Gamma_6|\Gamma_1|\Gamma_6>$ exists, while permanent dipole moments in other directions, $<c|r_x|c>$ and $<c|r_y|c>$, vanish. In contrast to the $\Gamma_6$ conduction band, permanent dipole moments for the $\Gamma_{4,5}$ valence band vanish in all directions.

Amongst the interband transitions, $<c|r_x|>$, $<c|r_y|v>$, and $<c|r_z|v>$, between $\Gamma_6$ and $\Gamma_{4,5}$, only the $<c|r_x|v>$ and $<c|r_y|v>$ transitions are allowed. As a result, the resonant enhancement of $d'_{15}$ dominates that of $d'_{33}$. The nonlinear coefficient $d_{33}$ is, therefore, enhanced more than the others, according to the above-mentioned relation between the two sets of coefficients.

Because the nonlinear coefficients of this invention are enhanced by the dipole moments, this invention decreases energy consumption of cascading based light switches and light-wavelength converters. As compared with DAST or other molecules, advantages of ordered semiconductors is their high quality, large size, waveguide-design flexibility, stability at high temperatures, and fabrication-process reliability. The high quality of semiconductors increases the reliability of devices particularly at the input and output surfaces. Besides, ordered semiconductors are suitable for integrating switches and other devices, because large-size high-quality ordered semiconductors can be grown by conventional metalorganic vapor phase epitaxy (MOVPE), molecular beam epitaxy (MBE), gas-source MBE (GSMBE), and other epitaxial-growth techniques.

Exemplary devices constructed according to the present invention are cascading light-wavelength converters, as well as cascading light switches. Light-wavelength conversion can be achieved, for example, by launching a pump light with a wavelength of $\omega_p$, whereby the nonlinear coefficient changes the input wavelength of $\omega_i$, to $\omega_p-\omega_i$. By using, for example, a 775.5 nm pump light, signals in a 1550 nm wavelength WDM channel are converted into a 1552 nm signal. In another example, a 707 nm pump light converts 1.550 μm signals to 1300 nm signals, and vice versa. The phase-matching conditions for these wavelength conversions according to the preferred embodiment of the present invention are realized in a manner similar to the switches. Phase matching condition among [0,0,1]-polarized $\omega_i$, $\omega_p$, and $\omega_p-\omega_i$ lights is satisfied through the (3,3) component modulation between $d_{33}$ and zero. Phase matching among [1,1,0]-polarized $\omega_i$, [0,0,1]-polarized $\omega_p$, and [1,1,0]-polarized $\omega_p-\omega_i$ lights is satisfied through the (3,1) component modulation between $d_{31}+d_{14}$ and $d''_{14}$. The large modulation depth and large coefficient value increase the conversion efficiency. This device does not need any high-frequency electronic device for the conversion, and the speed of the present invention converter is as fast as the above-mentioned nonlinear switches.

Moreover, the converter according to the preferred embodiment is suitable for large-scale integration, because semiconductor lasers cover the pump-light-wavelength range. An AlGaAs laser grown on a GaAs substrate covers the 775.5 nm wavelength region. An AlGaInP lasers grown on a GaAs substrate covers the 707 nm region, by using compressively strained quantum wells as the laser active layer. Therefore, it is possible to integrate both the converters and pump light sources on a single wafer.

Ordered semiconductors suitable for the devices according to the present invention include semiconductors grown on (1,1,1) and ($\overline{1}$,1,1) semiconductor substrates. The order period is two-to-five times as long as the original lattice constant in the growth direction. Several growth techniques realize perfect ordering in the [1,1,1] and [$\overline{1}$,1,1] directions. The increase in the degree of ordering enhances the $C_{3v}$-based nonlinear coefficients, $d_{33}$, $d_{31}$, and $d_{15}$. In case of GaInP, the degree of ordering for naturally ordered GaInP were reported as approximately 30% or less. Nonlinear coefficients for perfectly ordered GaInP is, therefore, enhanced to be three times larger than those for naturally ordered GaInP. The growth techniques for these crystals include MBE, metalorganic MBE, gas-source MBE, chemical beam epitaxy, MOVPE, and atomic-layer epitaxy. Dry-etch techniques are suitable to form input and output facets of waveguides grown on (1,1,1) and ($\overline{1}$,1,1) substrates, in stead of cleaved facets.

In summary, it can be seen from the above that the present invention uses the particular propagation direction in the ordered semiconductors to achieve nonlinear phase shift, sum-frequency generation and second harmonic generation, while utilizing periodic disordered regions to achieve QPM. As a consequence the need for wafer bonding or asymmetric quantum wells to achieve second harmonic generation is eliminated, while the input power for a device built according to the present invention can be substantially lower than that of the prior art devices.

Figure 2:
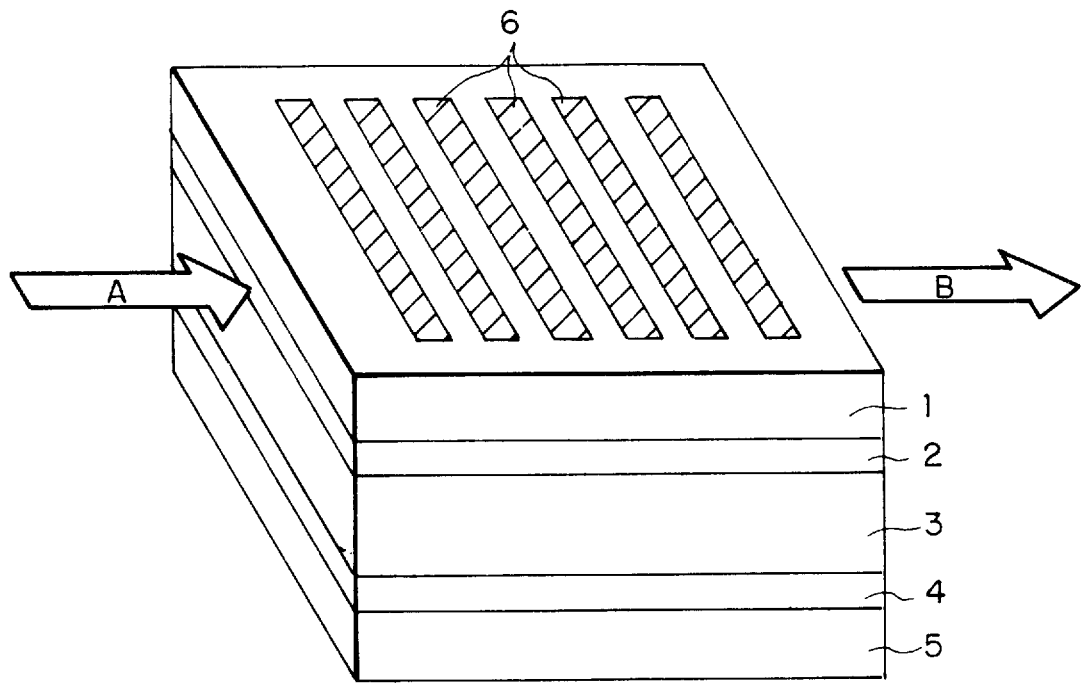
FIG. 2 depicts a nonlinear, quasi phase matched device according to an embodiment of the present invention.
Figure 2:
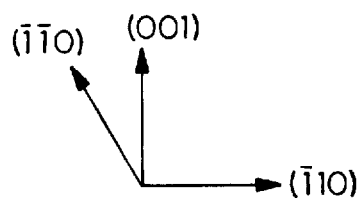

FIG. 2 shows an example of a phase shift device using ordered semiconductors according to an embodiment of the present invention. The basic features of the device shown in the figure can be used to form a cascading switch or as a light converter, as will be explained more fully below. (A general overview of the physics of all-optical switching devices can be found in Photonics In Switching, Vol. 1, Academic Press, Inc., 1993, ISBN 0-12-496051-0; particularly, chapter 5, pp. 81–87, 98–103. An understanding of the general principles described in this reference would assist the reader to understand the description which follows hereinbelow.)

The structure of the preferred embodiment of the device depicted in FIG. 2 is as follows. A GaAs buffer layer 4 is provided on a (0,0,1) GaAs substrate 5. In the preferred embodiment, the GaAs buffer layer 4 and other layers to be described below are grown on the (0,0,1) GaAs substrate 5 by MOVPE. An AlGaInP first clad layer 3 is provided on top of the GaAs buffer layer 4, and the AlGaInP guide layer 2 is provided on top of the first clad layer 3. Finally, an AlGaInP second clad layer 1 is provided on top of the guide layer 2.

Then, the device is exposed to a disordering process to create the periodic disordered regions 6. The periodical disordering of the guide layer may be performed by technologies such as a selective-area impurity diffusion, a selective-area impurity implantation, etc. For example, the inventor has previously reported that Zn diffusion disorders the natural superlattice of GaInP and increases the bandgap energy. Ueno et al., "Novel Window-Structure AlGaInP Visible-Light Laser Diodes with Non-Absorbing Facets Fabricated by Utilizing GaInP Natural Superlattice Disordering", *Japanese Journal of Applied Physics,* Vol. 29, No. 9, September, 1990, pp. L1666–L1668, incorporated herein by reference.

Figure 1B:
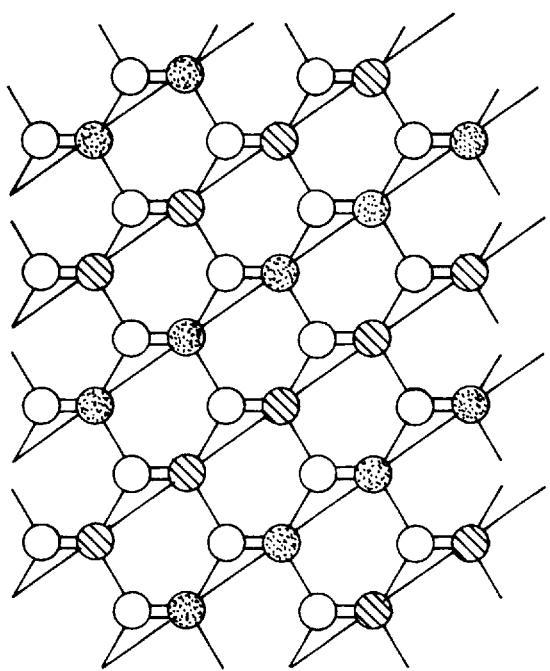
FIG. 1b depicts the crystal structure of a disordered section in an ordered semiconductor (GaInP)
Figure 3:
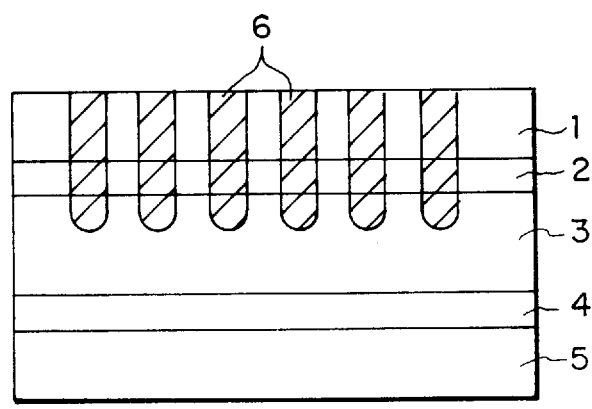
FIG. 3 is a cross-sectional view of the device of FIG. 1.

FIG. 3 shows a cross-sectional view of the periodically disordered regions in the device of FIG. 2. The impurity-diffused regions reach the top of the first clad layer 3, so as to ensure complete disordering of the guide layer 2. However, it should be noted that while in the embodiment of FIG. 1 the periodic disordering regions are shown to extent through the first and second clad layers, 1 and 3, this is only a consequence of the preferred manufacturing method contemplated. The advantageous effect of the present invention can be achieved even when the disordered regions are confined only to the guide layer 2.

In this exemplary embodiment, AlGaInP is used for the cladding and guide layers. However, the Al is not a necessary element for achieving the features of the present invention. Rather, Al is used to control the refractive index and the bandgap of the various layers in a known manner. Therefore, the Al can be eliminated and a GaInP can be used instead. The guide layer in the preferred embodiment is comprised of $(Al_xGa_{1-x})_{0.5}In_{0.5}P$ crystals which are ordered and disordered periodically. In the preferred embodiment, the guide layer has a smaller aluminum content than the $(Al_yGa_{1-y})_{0.5}In_{0.5}P$ cladding layers, x<y. As a result, the refractive index of the guiding layer is larger than that of the cladding layers, and consequently the guiding layer confines the propagating light.

An example of a device according to the embodiment of FIG. 2 which is adapted to operate at 1.550 μm is: a 4.0-μm thick $(Al_{0.7}Ga_{0.3})_{0.5}In_{0.5}P$ first clad layer 3, a 0.400 μm-thick $Ga_{0.5}In_{0.5}P$ guide layer 2, and a 1.0-μm thick $(Al_{0.7}Ga_{0.3})_{0.5}In_{0.5}P$ second clad layer 1. The disordering period for this waveguide structure is approximately 2.6 μm, as designed based on the difference in effective refractive-indices for the 1550 nm fundamental and 775 nm second-harmonic light. The approximately 1.85-eV bandgap energy of $Ga_{0.5}In_{0.5}P$ is sufficiently large to prevent absorption of the second-harmonic light and two-photon absorption for the fundamental-frequency lights. On the other hand, the small denominator $E_g-2\omega$ of 250 meV in the resonant terms advantageously enhances the nonlinear coefficients. As noted above, according to this preferred embodiment, the AlGaInP layers 1–3 and the GaAs buffer layer 4 are grown on a (0,0,1) GaAs substrate 5 by MOVPE. The degree of ordering is optimized by the growth conditions and the substrate orientation. For devices using 1300 nm light signals, an AlGaInP guide layer 2, such as $(Al_{0.4}Ga_{0.6})_{0.5}In_{0.5}P$, having a larger bandgap energy is preferable as the guide layer.

The propagation direction of these waveguides is not limited to the $[\bar{1},1,0]$ direction shown in the figure. Propagation directions such as [1,1,0], [1,0,0], [0,1,0], etc., are also possible, as shown by the above matrices derivations.

AlGaInP crystals having lattice-mismatch-induced strains are also applicable. In addition to AlGaInP, other ordered semiconductors, such as AlGaInPAs grown on GaAs, InAlAs grown on InP, AlGaInN, etc., are also applicable. The difference in chemical bond lengths causes atomic ordering during the growth process.

The basic structure of the device depicted in FIGS. 2 and 3 can operate as an all-optical self switching device by, for example, varying the amplitude of the pulses in the signal referenced by arrow A. This feature would be more fully developed below with respect to examples of possible implementations of the present invention.

The device shown in FIG. 2 can also function as a wavelength converter which changes wavelength of the input lights when the pump light is launched with the input lights as mentioned previously. More specifically, in FIG. 2 this is illustrated by considering the arrow A to include both the signal light and the pump light. Thus, the frequency of the signal light depicted by arrow B would be different from the signal light designated by the arrow A. This will also be explained below with regards to examples of possible implementations of the present invention.

Figure 4:
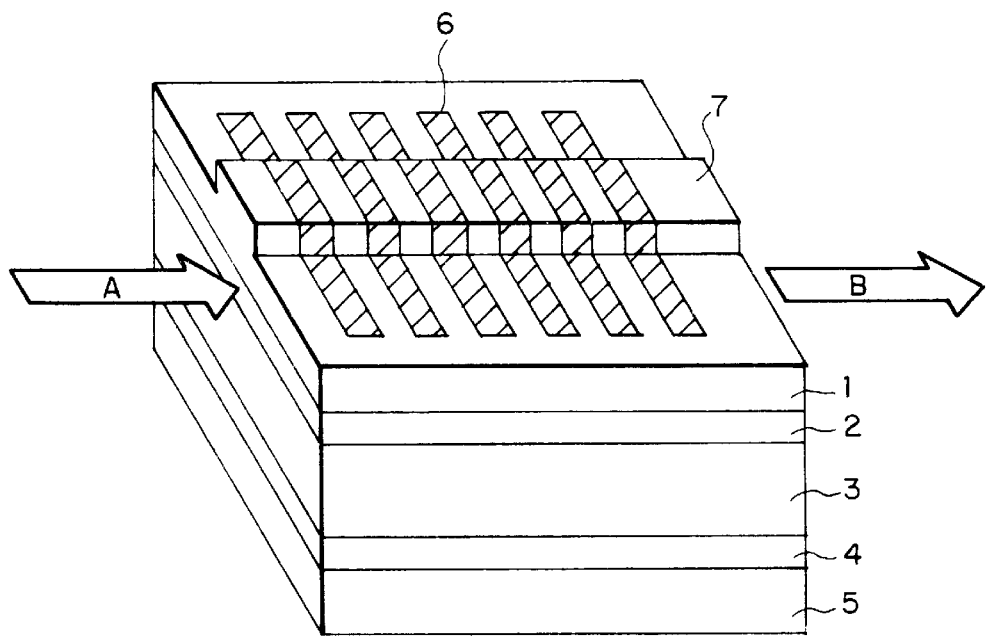
FIG. 4 depicts another nonlinear, quasi phase matched device according to another embodiment of the present invention.

FIG. 4 shows another example of a phase-shift device according to another embodiment of the present invention. The device of FIG. 4 is similar to that of FIG. 2, except that a ridge 7 (channel) is provided on the top section thereof. The ridge 7 contributes to stabilizing the fundamentals transverse-mode. That is, the ridge is designed so that it allows only one transverse mode, generally known as the fundamental transverse mode to propagate through the device. Consequently, the fundamental transverse mode is "filtered" by the waveguide itself. As shown in FIG. 4, the disordered regions extend to the ridge 7, however, as noted earlier, the advantageous effects of the present invention can be brought about even if the disorder regions are confined only to the guide layer 2.

Similar to the device of FIG. 2, the general structure of the device of FIG. 4 can be used as a switch, a light converter, or both, depending on the actual implementation and the nature of the incident light depicted by arrow A. For a switch, the incident light may have a modulated amplitude or may include a signal and a control light. For a light converter, the incident light would include the signal light and a pump light. FIGS. 5 and 6 provide additional information that may help understand these concepts.

Figure 5A:
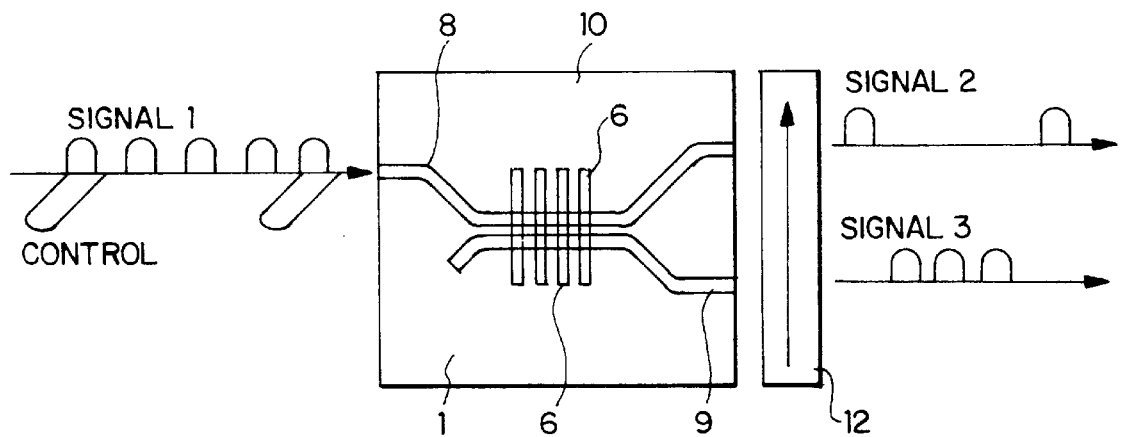
FIG. 5A is a top view schematic demonstrating the utilization of the devices according to FIGS. 1 and 3 as a light demultiplexing switch.
Figure 6:
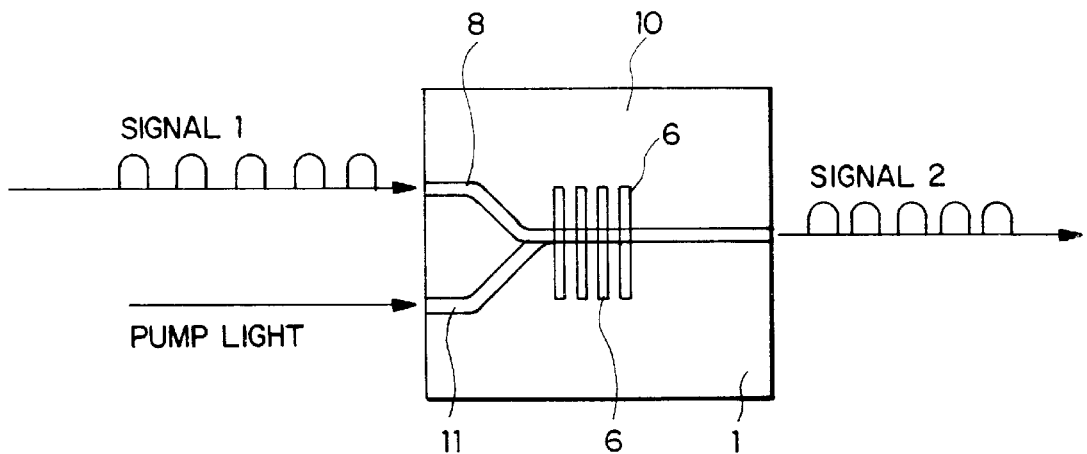
FIG. 6 is a top view schematic demonstrating the utilization of the devices according to FIGS. 1 and 3 as wavelength converter.

FIG. 5A shows a top view of a light switch using the phase shift regions similar to those of FIGS. 2 and 4, and a directional-coupler structure. This exemplary switch works as a demultiplexer. (For a report on an AlGaAs based demultiplexer using $\chi^{(3)}$ rather than the $\chi^{(2)}:\chi^{(2)}$ cascading mechanism, the reader is referred to A. Villeneuve et al., "Demonstration of All-Optical Demultiplexing at 1555 nm With an AlGaAs Directional Coupler", *Electronics Letters,* Vol. 29, No. 8, Apr. 15, 1993, pp. 721–22). Two channels 8 and 9 are provided. At the closely-aligned section in the nonlinear directional-coupler (NLDC) interaction region 10, in the center of the device, the channels 8 and 9 have a periodical disorder-order guide layer for QPM (the guide layer itself is concealed from this view by clad layer 1, however, the disordered regions 6 are shown since, in the preferred embodiment, they are also present in the clad layer 1). Outside the interaction region, the channels 8 and 9 have an ordered guide layer to guide input and output lights. However, it is also contemplated that a disordered region may be used in the channels 8 and 9 outside the interaction region. The polarizer 12 is used to restrict the control signals from passing as output signal.

In the particular exemplary embodiment depicted in FIG. 5A, signal 1 has a frequency f1, signal 2 has a frequency f2 and signal 3 has a frequency f3. Since in this particular example the device operates as a demultiplexer f1=f2=f3. Similarly, the control signal may also be of the same frequency.

As is known in the art, in the interaction region 10 the signal wave, signal 1, is coupled to, and diverts light energy between, the guide channels 8 and 9. This coupling is wavelength dependent. Depending on the phase shift and the geometry of the device, signal 1 can be made to appear at the output of channel 8, channel 9 or both. Accordingly, by selectively applying phase shift to the incoming signal pulses, each pulse can be directed to exit on either channel 8 or 9, to thereby operate as a demultiplexer switch.

In the device of this embodiment, the signal's phase is shifted by the second harmonic generation and QPM in the interaction region 10. The amount of phase shift of signal 1 depends on whether a control signal having a polarization of 90° with respect to the signal 1 is applied therewith. As shown in this example, when a control signal is applied, the phase of the pulse is shifted so that it exits on channel 8. On the other hand, when no control pulse is applied, the pulse exits on channel 9.

Figure 5B:
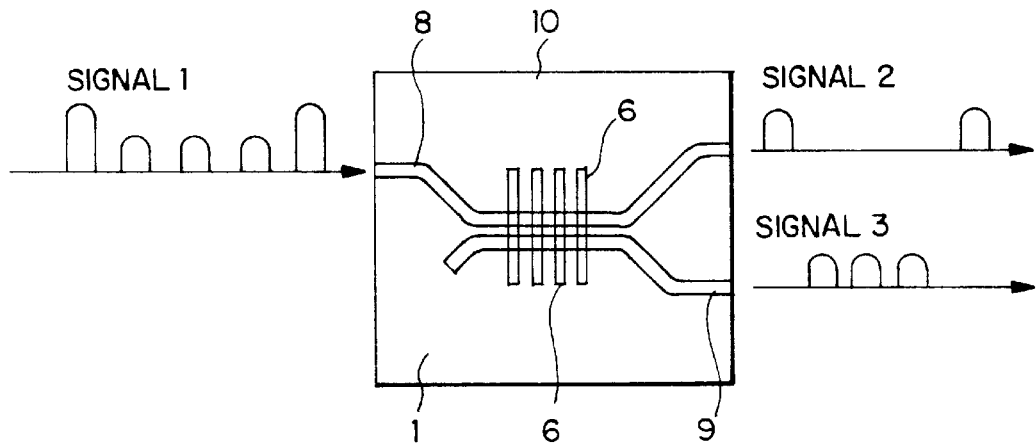
FIG. 5B is a top view schematic demonstrating the utilization of the device according to FIGS. 1 and 3 as a self demultiplexing switch.

A self demultiplexing switch is shown in FIG. 5B using a nonlinear directional coupler (NLDC). The basic device is similar to that shown in FIG. 5A and, therefore, the same reference characters are used. The basic physics of the operation of such a device can be found in G. Assanto et al., "All-Optical Switching Devices Based On Large Nonlinear Phase Shifts From Second Harmonic Generation", *Appl. Phys. Lett.*, Vol. 62, No. 12, Mar. 22, 1993, pp. 1323–25.

To generate self switching in this device, the relative phase between channel 8 and channel 9 is changed depending on the input power of the signal 1. As is known in the art, in the interaction region 10 channels 8 and 9 need to be sufficiently close to permit energy exchange between the waves in these channels. Depending on operational conditions and the performance sought, the number of disordered regions 6 may be different in each of channels 8 and 9 so as to create phase offset/enhancement into one of the channels. As can be understood from the above and FIG. 5B, the self switching device of this embodiment can be used for signal routing, i.e., as a self routing device.

FIG. 6 depicts an example of utilizing the structure of the present invention to construct a light wavelength converter. As noted above with respect to FIGS. 2 and 4, the device of the present invention can operate as a light wavelength converter by applying the pump light together with the signal light. The combination of the signal and pump light can be done prior do reaching the device by means such as, for example, a pig tail arrangement. Alternatively, the signal and pump light may be combined in the device itself. An example of how this can be done is shown in the exemplary embodiment of FIG. 6.

In FIG. 6 the signal light is applied to channel 8 and pump light is applied to channel 11. In this example channel 11 "feeds" into channel 8 before reaching the interaction region 10. As can be understood, in this example the frequency f1 of the incident signal 1 is converted in the interaction region 10 due to the sum-frequency generation (under the QPM condition) and, as a result, the frequency f2 of the exiting signal 2 is different than f1.

Figure 7:
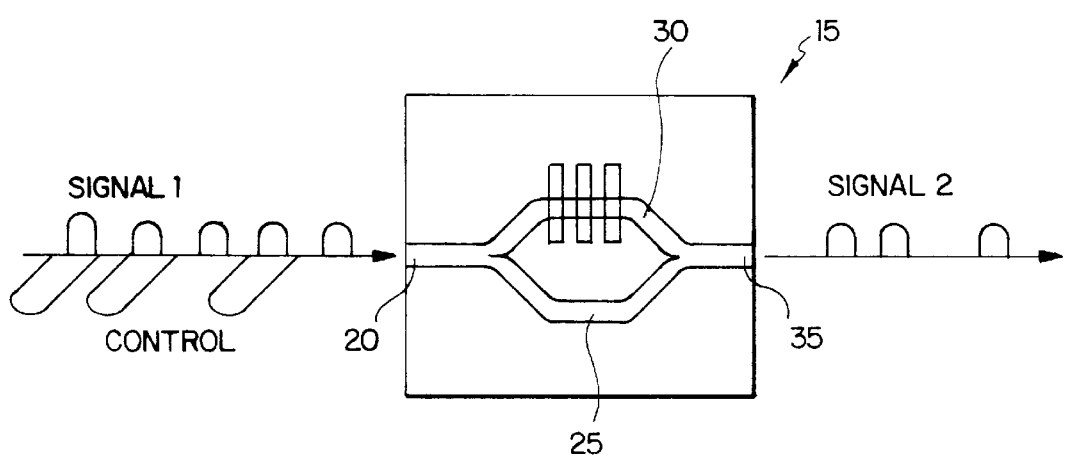
FIG. 7 depicts a Mach-Zehnder type switch constructed using the nonlinear, quasi phase matching structure according to the present invention.

FIG. 7 shows a Mach-Zehnder-type switch 15. The general principles of a Mach-Zehnder interferometer are known in the art and can be found in, for example, the Gaetano article cited above and in Y. Baek, "All-Optical Switching in a Hybrid Mach-Zehnder Interferometer as a Result of Cascaded Second-Order Nonlinearity", *Optics Letters*, Vol. 20, No. 21, Nov. 1, 1995, pp. 2168–70, incorporated herein by reference. As is known in the art, the input waveguide 20 is split into two path guides 25 and 30 (sometimes referred to as sensing and reference paths), and then recombined into a single output guide 35. One of the two path guides (in this exemplary embodiment path guide 30) has the QPM structure to cause nonlinear phase difference between signal lights propagating in the two path guides 25 and 30. The signal pulse is transmitted when the pump pulse coincides with the signal pulse and the signal is reflected when the pump does not coincide with the signal.

Figure 8:
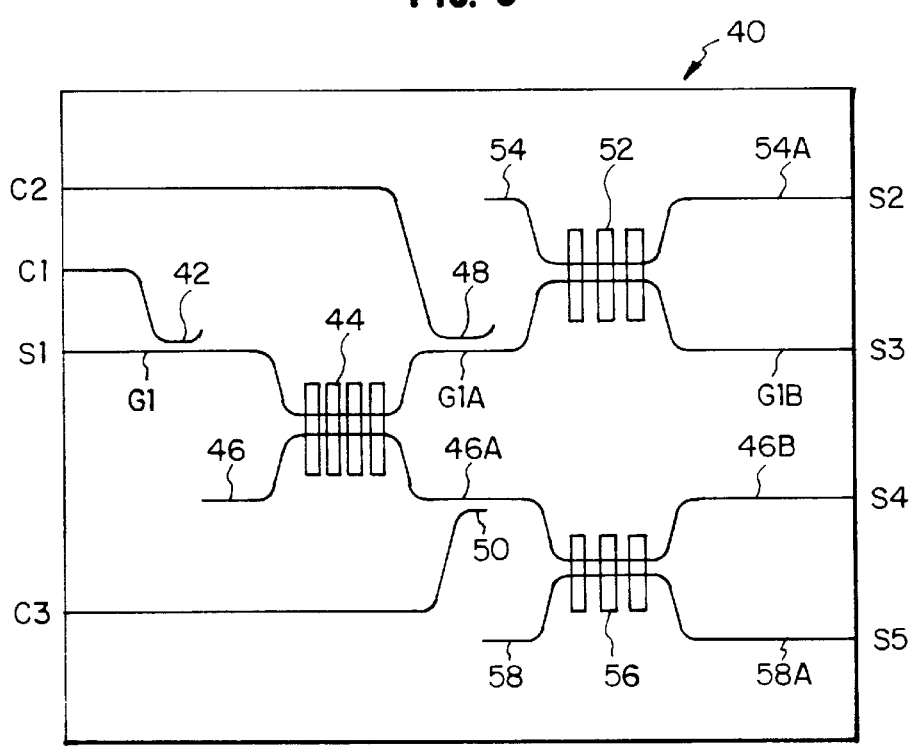
FIG. 8 is a schematic representation demonstrating an integration of several phase shift devices and switches according to the present invention.

FIG. 8 shows several light switches integrated onto one semiconductor chip 40. Conventional process techniques developed for III–V semiconductors can be used for the integration. In this particular exemplary integrated chip, a single light signal S1 is input together with three control signals C1, C2 and C3. The exemplary device is so constructed that it provides four output light signals S2, S3, S4 and S5. Thus, a single input light signal S1 can be processed into four output signals S2–S4 depending on the control signals C1–C3 applied.

In the integration example of FIG. 8, the control signal C1 is coupled to the input signal guide G1 via coupler 42. The signal guide G1 is then structured into an interaction region 44 together with guide 46. Periodic disordered regions according to the present invention are provided in the interaction region 44. As a consequence, the input signal applied to input guide G1 is processed into two signals propagating in portion G1A of guide G1 and 46A of guide 46. A second coupler, 48, is used to couple the control signal C2 to the processed signal propagating in guide portion G1A. Similarly, a coupler 50 is used to couple the control signal C3 to the processed signal propagating in guide 46A.

Thereafter, the guide portion G1A is structured into an interaction region 52 together with guide 54, and the guide portion 46A is structured into an interaction region 56 together with guide 58. Periodic disordered regions according to the present invention are provided in the interaction regions 52 and 56. Thus, the signals propagating in guide portions G1A and 46A are processed into four output guides 54A, G1B, 46B and 58A. It should be apparent to those skilled in the art that the device of FIG. 8 only provides an example of integration and many other variations are possible.

Figure 9:
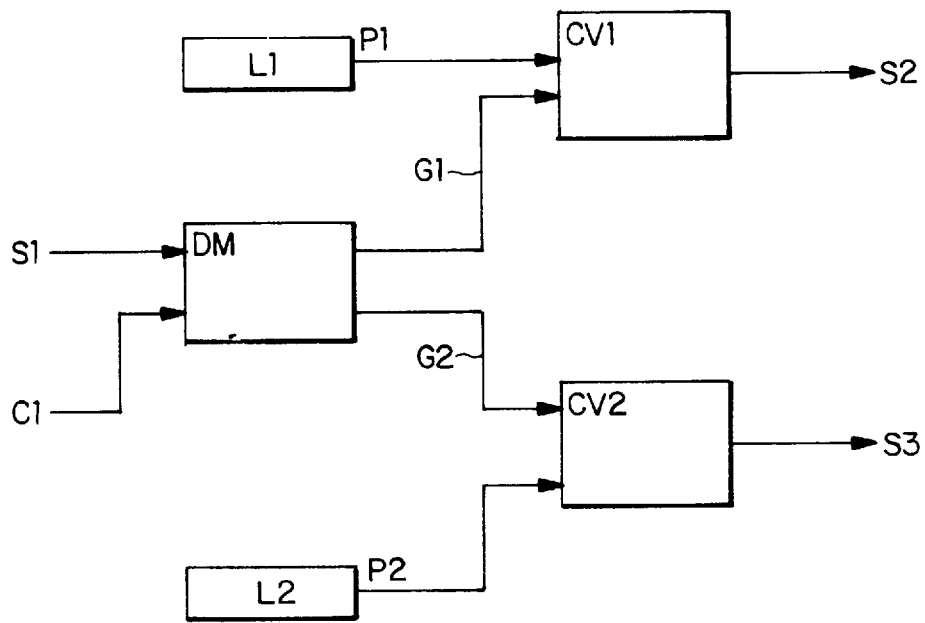
FIG. 9 is a schematic diagram of integrated light switches and light-wavelength converters.

FIG. 9 shows a schematic view of light switches and light-wavelength converters utilizing the features of the present invention. All these devices including light sources are integrated on one semiconductor wafer.

More specifically, a signal light S1 having frequency f1 is input to a demultiplexer switch DM constructed according to the present invention, i.e., out of an ordered semiconductor having periodic disordered regions provided therein. A control signal C1 is also applied to the demultiplexer DM so as to process the input signal S1. Part of the processed signal is output to guide G1 and another is output to guide G2. The signal from the guide G1 is input to a wavelength converter CV1 constructed according to the present invention, e.g., according to the embodiment of FIG. 6, and the signal from the guide G2 is applied to a second wavelength converter CV2 constructed according to the present invention.

Two conventional pump lasers L1 and L2 are provided. In the preferred embodiment the pump lasers L1 and L2 are integrated in the chip to provide a fully integrated device. Of course, alternatively these lasers can be provided outside of the device and wave guides can be used to apply the signal to the device. The output of pump laser L1 is applied to the wavelength converter CV1 via pump guide P1. Similarly, the output of pump laser L2 is applied to the wavelength converter CV2 via pump guide P2. Thus, the signals of guides G1 and G2 are processed in the respective interaction regions to provides output signals S2 and S3 which may have different frequency than that of the input signal S1. Moreover, since two pump lasers are provided, the frequency of output S2 can be different than that of output S3.

Figure 10A:
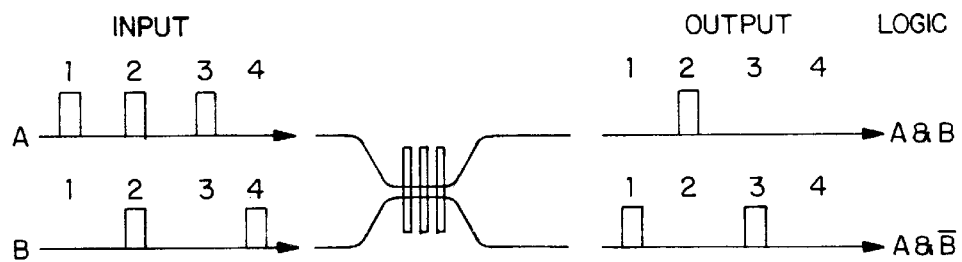

In FIG. 10A the device according to the present invention is used to provide an exemplary (A and B) and (A and $\overline{B}$) logic switch. In contrast, in FIG. 10B the device is used together with a coupler to provide an exemplary (A AND B) and (A XOR B) logic switching. The device of FIG. 10A would operate in a manner similar to that of FIG. 5B and, therefore, a detailed explanation is omitted.

Figure 10B:
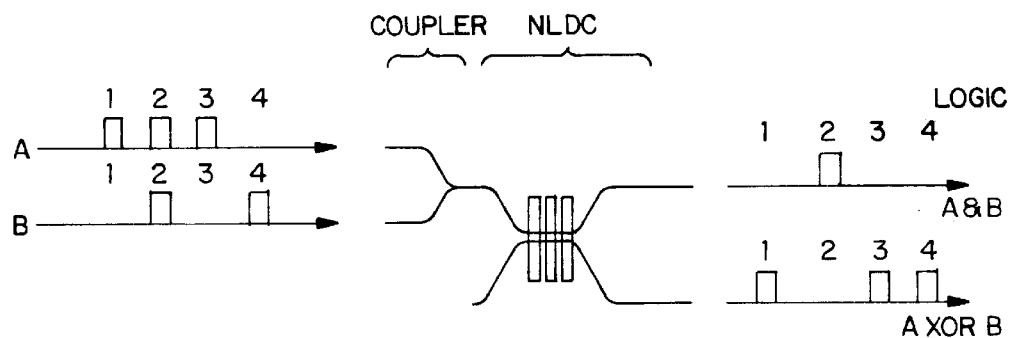

In FIG. 10B the input signal A and the control signal B have the same magnitude and same polarization in a known manner. When the input and control pulses coincide, they are added together in the coupler which can be of any conventional structure and does not include periodic disordering. However, in order to provide the self switching, periodic disordered regions are needed in the NLDC.

Figure 10C:
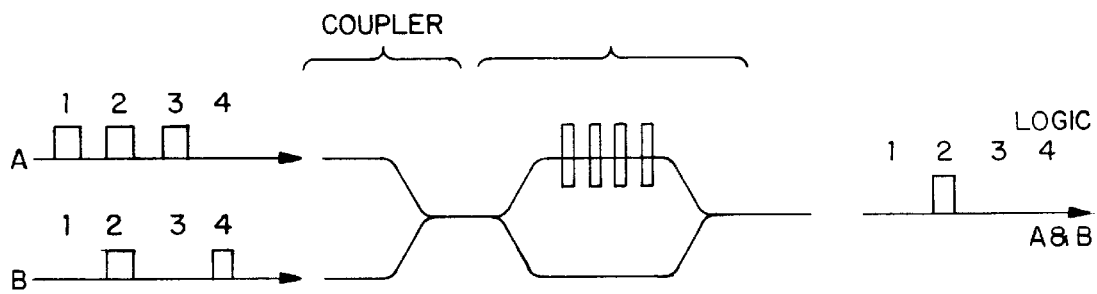
FIG. 10C is a schematic diagram of an exemplary configuration of using the device according to the present invention to provide logic switching using a Mach-Zehnder interferometer.

In FIG. 10C an exemplary device is depicted demonstrating the utilization of the present invention to construct an all-optical "logical switching" using a Mach-Zehnder interferometer. Similar to the embodiment of FIG. 10B, this embodiment includes a conventional coupler which does not include periodic disordered regions. Also, as in the embodiment of FIG. 10B, the input signal A and the control signal B are of the same intensity and polarization as well known in the art. Once the input signal A and the control signal B are combined, the wave guide is split into the two channels of the Mach-Zehnder interferometer.

As shown in the FIG. 10C, one channel of the interferometer is provided with periodic disordered regions to generate nonlinear phase shift. In this particular exemplary embodiment, the channel are structured so that when the signal entering the interferometer is of an intensity of the input signal A, the phase shift created by the cascading effect equals to π. Consequently, the signal is reflected at the recombination of the channels and is not transmitted to the output. In contrast, when the combined signal is of an intensity of A+B, due to coincidence of a pulse from the input signal A and a pulse from the control signal B, the phase shift resulting from the cascading effect equals to 0 and, consequently, the pulse is passed to the output.

As can be understood from the above disclosure, the present invention is advantageous in various ways. It enables the fabrication of ultrafast all-optical devices. The fabrication of these devices according to the present invention utilizes conventional processing methods such as MOVPE, photo-lithography patterning, impurities diffusion etc. In addition, the various devices according to the present invention can be easily integrated in a single integrated circuit. While the devices according to the present invention can provide ultrafast operation, their power requirement is low, thereby enabling the construction of efficient integrated circuits containing various devices according to the present invention.

While the invention has been described with reference to specific embodiments thereof, it will be appreciated by those skilled in the art that numerous variations, modifications, and embodiments are possible, and accordingly, all such variations, modifications, and embodiments are to be regarded as being within the spirit and scope of the invention.

What is claimed is:

1. An optical semiconductor device comprising a guide layer defining a path for guiding an incident light therethrough, said guide layer being made of an ordered semiconductor having an axis of symmetry, wherein said guide layer has an interaction region interposed in said path and comprises periodic disordered regions created in said ordered semiconductor.

2. The optical semiconductor device of claim 1, wherein said axis of symmetry does not coincide with a growth axis of said ordered semiconductor.

3. The optical semiconductor device of claim 2, further comprising:
    a first clad layer having a defined refractive index and wherein said guide layer is provide on top of said first clad layer;
    a second clad layer having a defined refractive index, said second clad layer being disposed on top of said guide layer; and
    wherein the refractive index of said first and second clad layers is lower than a refractive index of said guide layer.

4. The optical semiconductor device of claim 1, wherein said guide layer is made of an ordered semiconductor material selected from the group consisting of GaInP, AlGaInP, GaInAs, InAlAs, and GaInPAs.

5. The optical semiconductor device of claim 3, wherein said guide layer and said first and second clad layers are made of an ordered semiconductor material selected from the group consisting of GaInP, AlGaInP, GaInAs, InAlAs, and GaInPAs.

6. The optical semiconductor device of claim 3, wherein said second clad layer includes a ridge disposed on a top portion thereof.

7. The optical semiconductor device of claim 3, further comprising:
    a first channel disposed in said guide layer, said first channel having one end defining a first signal input of said optical semiconductor device, and a second end defining a first signal output of said optical semiconductor device;
    a second channel disposed in said guide layer and having an end defining a second signal output of said optical semiconductor device; and
    a coupler provided in said interaction region for coupling said first and second channels.

8. The optical semiconductor device of claim 3, further comprising:
    a first channel disposed in said guide layer, said channel having one end defining a first signal input of said optical semiconductor device, and a second end defining a first signal output of said optical semiconductor device, said channel passing through said interaction region;
    a second channel disposed in said guide layer and having a first end coupled to an input side of said first channel and a second end coupled to an output side of said first channel, wherein said second channel by-passes said interaction region.

9. An optical semiconductor device, comprising:

a first clad layer;

a guide layer formed on said first clad layer, said guide layer comprising an ordered semiconductor material having a growth axis and an axis of symmetry;

an interaction section provided in said guide layer, said interaction region comprising a plurality of disordered semiconductor regions disposed periodically along a path of light-propagation direction;

a second clad layer formed on said guide layer; and wherein said path of light-propagation is in a direction perpendicular to said growth axis.

10. The optical semiconductor device of claim 9, further comprising a light propagation channel for guiding an incident signal light therethrough, said channel provided in said guide layer and traversing said interaction region.

11. The optical semiconductor device of claim 10, further comprising coupling region for coupling a pump light with said incident signal light.

12. The optical semiconductor device of claim 10, further comprising:

a second light propagation channel; and a coupling region for coupling at least part of said signal light into said second light propagation channel.

13. The optical semiconductor device of claim 10, further comprising:

a second channel disposed in said guide layer and having a first end coupled to an input side of said light propagation channel and a second end coupled to an output side of said light propagation channel, wherein said second channel by-passes said interaction region.

14. An integrated circuit having the optical semiconductor device of claim 10 integrally formed therein.

15. An integrated circuit having the optical semiconductor device of claim 10 integrally formed therein.

16. The optical semiconductor device of claim 10, wherein said guide layer is made of an ordered semiconductor material selected from the group consisting of GaInP, AlGaInP, GaInAs, InAlAs, and GaInPAs.

17. The optical semiconductor device of claim 10, wherein said guide layer and said first and second clad layers are made of an ordered semiconductor material selected from the group consisting of GaInP, AlGaInP, GaInAs, InAlAs, and GaInPAs.

* * * * *

UNITED STATES PATENT AND TRADEMARK OFFICE
CERTIFICATE OF CORRECTION

PATENT NO. : 5,815,628
DATED : September 29, 1998
INVENTOR(S) : Yoshiyasu UENO

It is certified that error appears in the above-identified patent and that said Letters Patent is hereby corrected as shown below:

Column 5, line 5, delete "device" and insert --devices--; and

Column 5, line 38, delete "1.5m" and insert --1.5µm--.

Column 6, line 29, delete "$d^{ij(ord:\ Td)}$" and insert --$d_{ij}^{(ord:\ Td)}$--.

Column 7, line 44, delete "the" and insert --on the--.

Column 8, line 25, delete "desire" and insert --desired--; and

Column 8, line 63, delete "where c> represents the conduction-band state, v>" and insert --where|c> represents the conduction-band state, |v>--.

UNITED STATES PATENT AND TRADEMARK OFFICE
CERTIFICATE OF CORRECTION

PATENT NO. : 5,815,628
DATED : September 29, 1998
INVENTOR(S) : Yoshiyasu UENO

It is certified that error appears in the above-identified patent and that said Letters Patent is hereby corrected as shown below:

Column 9, line 40, delete " $<c|r_z|c> \propto <\Gamma_6|\Gamma_1|\Gamma_6>$ " and insert -- $<c|r_z|c> \propto <\Gamma_6|\Gamma_1|\Gamma_6>$ --;

Column 9, line 41, delete " $<c|r_x|c>$ and $<c|r_y|c>$ " and insert -- $<c|r_x|c>$ and $<c|r_y|c>$ --; and Column 9, line 44, delete " $<c|r_x|>, <c|r_y v>$ " and insert -- $<c|r_x|v>, <c|r_y|v>$ --.

Column 12, lines 35-36, delete "fundamentals transverse-mode" and insert -- fundamental-transverse-mode --.

Signed and Sealed this

Twenty-fourth Day of August, 1999

Attest:

*Attesting Officer*

Q. TODD DICKINSON

*Acting Commissioner of Patents and Trademarks*